United States Patent
Yamakawa et al.

(10) Patent No.: US 6,819,174 B2
(45) Date of Patent: Nov. 16, 2004

(54) AMPLIFICATION DEVICE

(75) Inventors: Junichiro Yamakawa, Tokyo (JP); Yoshinari Nanao, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/390,605

(22) Filed: Mar. 19, 2003

(65) Prior Publication Data

US 2003/0184313 A1 Oct. 2, 2003

(30) Foreign Application Priority Data

Mar. 28, 2002 (JP) ........................................ 2002-090538

(51) Int. Cl.$^7$ ................................................ H03F 1/00
(52) U.S. Cl. ...................................... 330/151; 330/149
(58) Field of Search .............................. 330/151, 149; 375/297; 455/63

(56) References Cited

U.S. PATENT DOCUMENTS 6,011,434 A * 1/2000 Sakai .......................... 330/151
6,320,464 B1 * 11/2001 Suzuki et al. ................ 330/151
6,680,649 B2 * 1/2004 Rydin .......................... 330/149

FOREIGN PATENT DOCUMENTS

JP 09064780 3/1997
JP 2000312116 11/2000

* cited by examiner

Primary Examiner—Henry Choe
(74) Attorney, Agent, or Firm—Winderoth, Lind & Ponack, L.L.P.

(57) ABSTRACT

The object of this invention is to reduce the cost of an amplification device that has a distortion detection loop that uses an amplifier to amplify the signal subject to amplification and detect the distortion arising in said amplifier, and a distortion removal loop that removes the distortion detected by the distortion detection loop from the signal amplified by said amplifier. This object is achieved by a configuration wherein the distortion detection loop consists of a first digital modulation means that, among two branches of a digital baseband signal subject to amplification that is divided into two, uses one branch of the signal to modulate a carrier signal, an amplifier that amplifies this modulated signal, delay means that delays the other branch of the digital baseband signal, a second digital modulation means that uses the delayed signal to modulate a carrier signal, phase-change means that changes the phase of the modulated signal and distortion detection means that detects the distortion arising in the amplifier from the amplified signal and the phase-changed modulated signal.

23 Claims, 6 Drawing Sheets

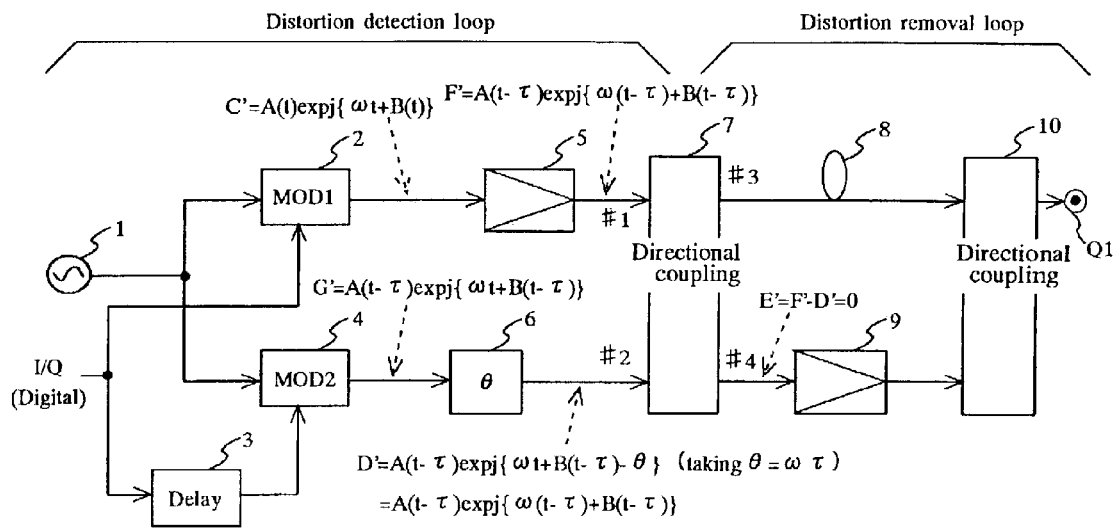
(Fig.1)

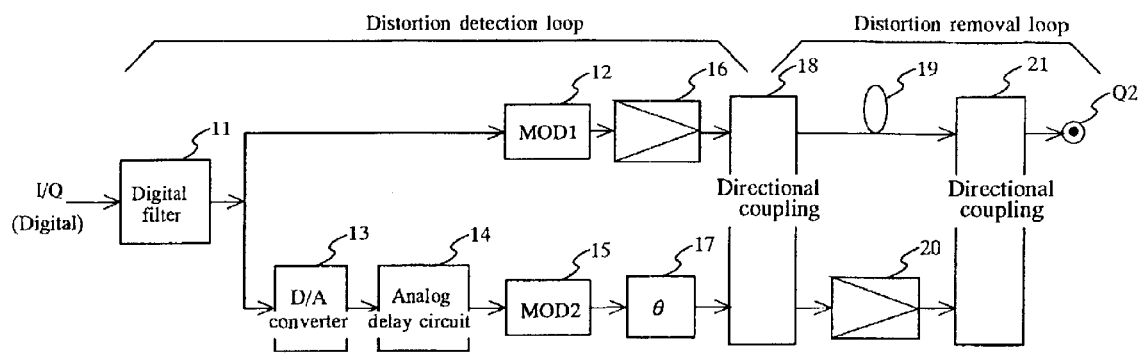
(Fig.2)

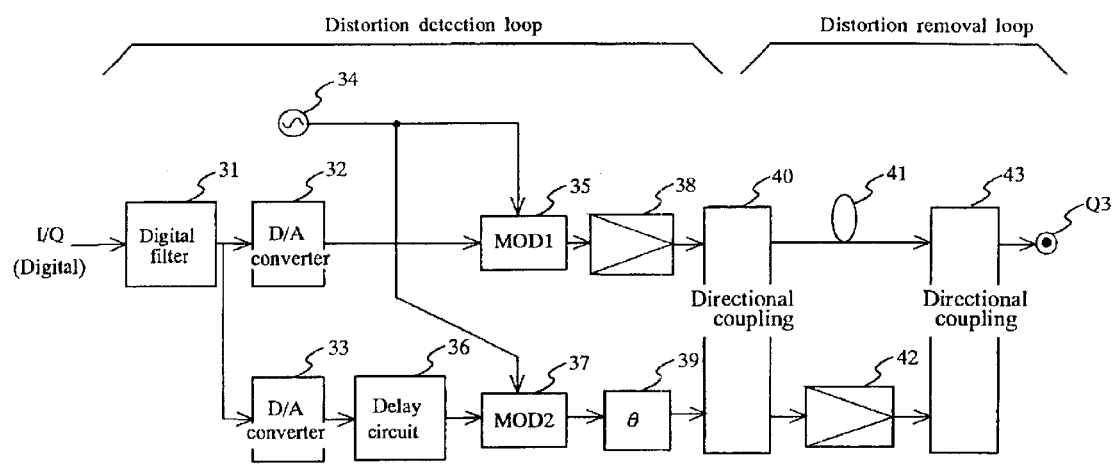
(Fig.3)

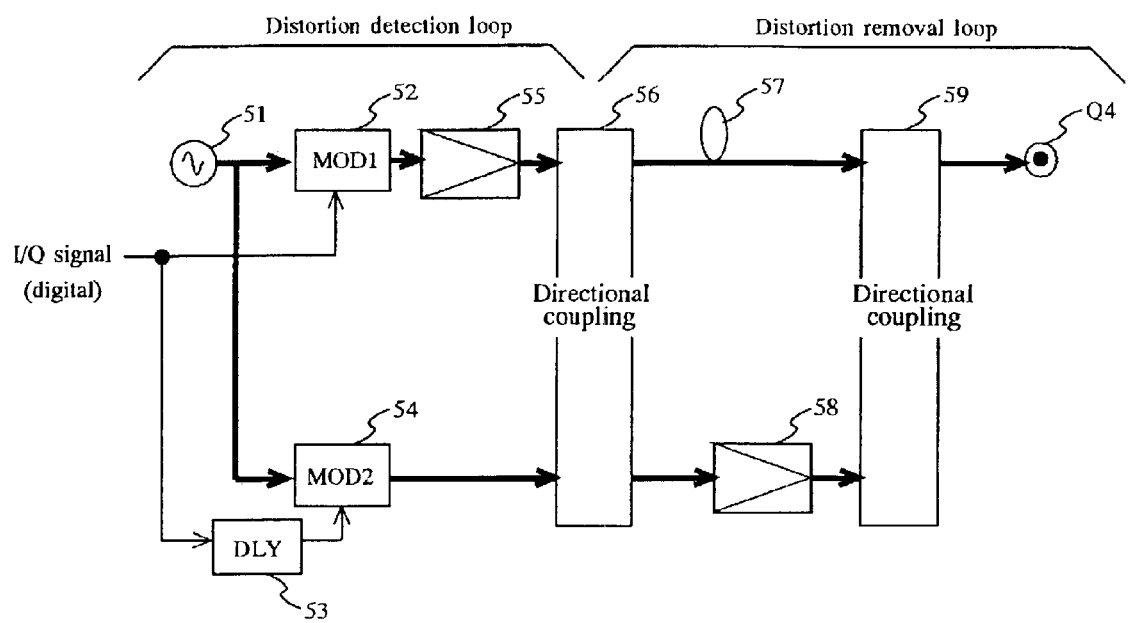
(Fig.4)

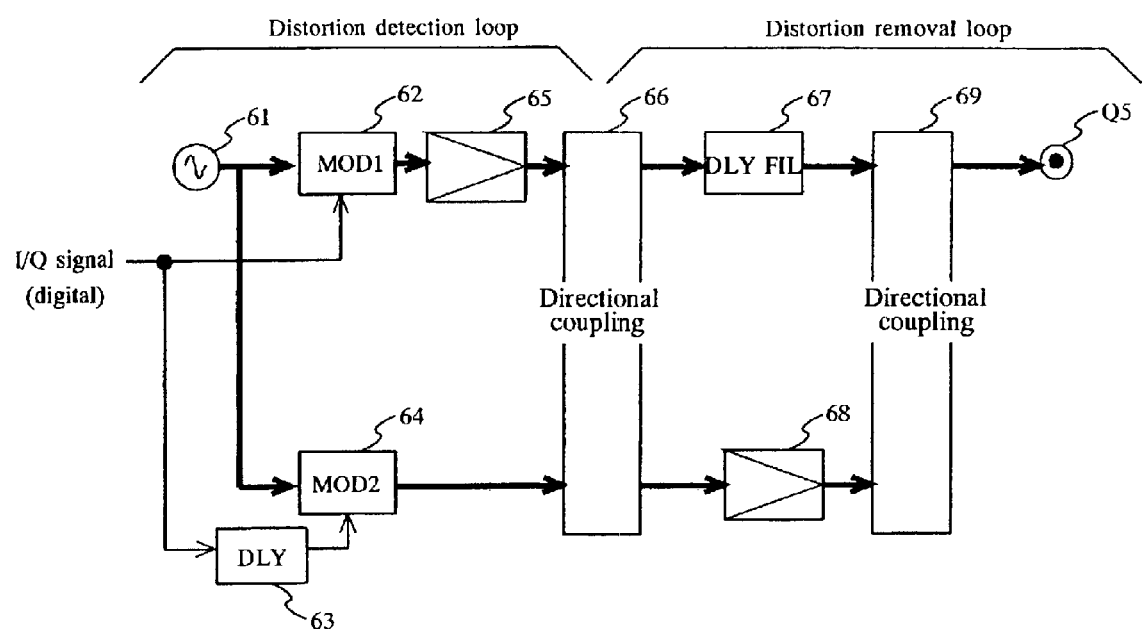
(Fig.5)

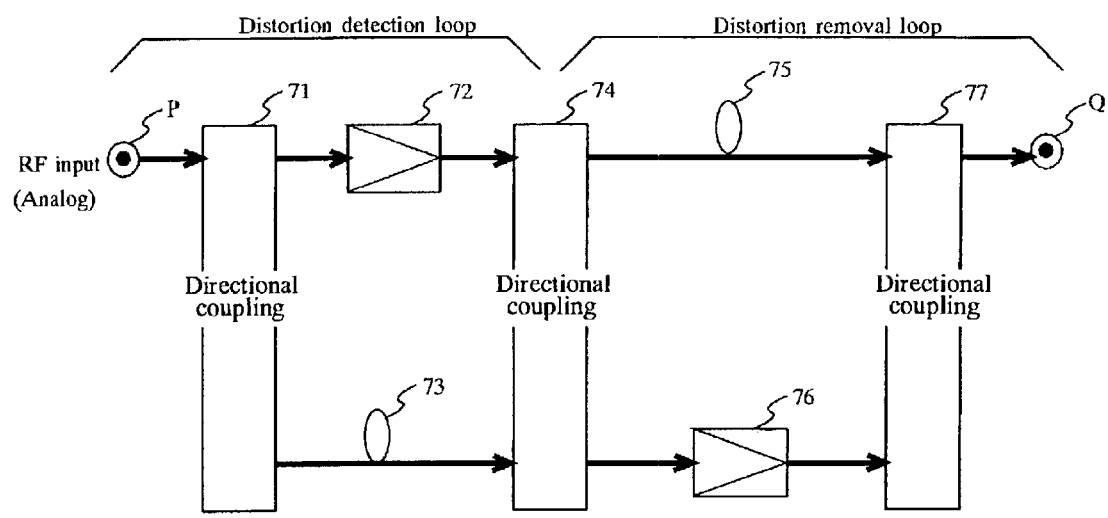
(Fig.6)

AMPLIFICATION DEVICE

BACKGROUND OF THE INVENTION

1. Field of the Invention

This invention relates to an amplification device that has a distortion detection loop and distortion removal loop, and that compensates for the distortion that arises in an amplifier due to a feedforward scheme, and particularly to an amplification device intended to reduce costs.

2. Description of the Prior Art

For example, in base stations provided for mobile communications systems, when the signal subject to transmission is amplified with an amplifier, compensation for the distortion that arises in such an amplifier is performed in order to achieve wireless communication with minimal distortion while satisfying the radio regulations for leak power in adjacent channels and the like. In addition, one example of an amplification device used to perform the compensation of distortion is an amplification device that performs distortion compensation by means of the feedforward (FF) scheme.

FIG. 6 shows an example of the constitution of an amplification device that performs distortion compensation by means of the feedforward scheme.

With the amplification device shown in the figure, in the distortion detection loop, a directional coupler 71 divides the analog signal in the radio frequency (RF) band input from the input terminal P and subject to amplification, and a main amplifier 72 amplifies one branch of the divided signal while a delay line 73 delays the other branch of the divided signal, and a directional coupler 74 takes the amplified signal from the main amplifier 72 and subtracts the delayed other branch of the divided signal to detect the distortion arising in the main amplifier 72. Here, the delay line 73 adjusts the timing of the processing of one branch of the divided signal and the other branch of the divided signal so that the distortion arising in the main amplifier 72 is detected by the directional coupler 74.

In addition, with the amplification device shown in the figure, in the distortion removal loop, the signal amplified by the main amplifier 72 is delayed by a delay line 75 and the distortion detected by the distortion detection loop is amplified by an auxiliary amplifier 76. A directional coupler 77 takes this delayed amplified signal from the main amplifier 72 and subtracts the amplified signal from the auxiliary amplifier 76 to obtain an amplified signal after compensation for the distortion in the amplified signal by the main amplifier 72 where the distortion components are reduced. This distortion-compensated amplified signal is then output from an output terminal Q. Here, the delay line 75 adjusts the timing of the processing of the signal amplified by the main amplifier 72 and the distortion detected by the distortion detection loop so that the distortion components in the signal amplified by the main amplifier 72 are removed.

Here, an example of the prior art is indicated by the circuit consisting of a modulator and the like as a distortion compensation circuit that uses a combination of a feedforward scheme and a pre-distortion scheme in the "distortion compensation circuit" recited in the publication of unexamined Japanese patent application (Kokai) No. JP-A-2000-212116 and in the circuit consisting of a delay circuit and the like as a pre-distortion scheme-based distortion compensation circuit that uses an image rejection-type frequency modulator in an up-converter and down-converter in the "base station used for wireless communication" recited in the publication of unexamined Japanese patent application (Kokai) No. JP-A-9-64780. Note that each of the techniques recited in the literature differ from the constitution and object of the present invention as recited hereinafter.

However, with a conventional amplification device based on the feedforward scheme as illustrated in FIG. 6 above, the distortion detection loop is constituted by using a coaxial cable or filter or other delay means to delay harmonically the signal in the wireless frequency band, so there are problems in that a relatively large device footprint is required and achieving low costs is difficult.

The present invention is intended to solve these problems in the prior art and has as its object to provide an amplification device that has a distortion detection loop and distortion removal loop, and that can achieve low costs when compensating for the distortion that arises in an amplifier due to a feedforward scheme.

SUMMARY OF THE INVENTION

In order to achieve the aforementioned object, the amplification device according to the present invention has a distortion detection loop that amplifies the signal subject to amplification with an amplifier and detects the distortion arising in said amplifier, and a distortion removal loop that removes the distortion detected by the distortion detection loop from the signal amplified by said amplifier, and the distortion detection loop and distortion removal loop compensate for the distortion that arises in said amplifier by means of a feedforward scheme, based on a distortion detection loop constituted as follows.

To wit, in the distortion detection loop, among the two branches of the digital baseband signal subject to amplification that is divided into two, a first digital modulation means uses one branch of the digital baseband signal to modulate a carrier signal, an amplifier amplifies the modulated signal obtained from the first digital modulation means, delay means delays the other branch of the digital baseband signal, a second digital modulation means that uses the other branch of the digital baseband signal delayed by the delay means to modulate a carrier signal, phase-change means changes the phase of the modulated signal obtained from the second digital modulation means, and distortion detection means detects the distortion arising in said amplifier from the signal amplified by the amplifier and the modulated signal whose phase is changed by the phase-change means.

Accordingly, for example, if a constitution is adopted such that a baseband signal in a frequency band lower than the wireless frequency band (the other digital baseband signal) is subject to delay by the delay means of the distortion detection loop and this baseband signal is converted to a signal in the wireless frequency band by means of modulation of the carrier frequency of the wireless frequency band after this delay, it is possible to achieve a smaller device footprint and lower cost than in the prior art, for example. In addition, because the constitution is such that a digital baseband signal is delayed, it is possible to achieve lower costs by the conversion to digital and the adjustment of the delay time can be automated to simplify the work of adjusting this delay time.

Here, various signals may be used as the signal subject to amplification, as signals subject to wireless transmission may be used, for example.

In addition, amplifiers of various constitutions may be used.

In addition, amplifiers typically suffer from intermodulation distortion and other types of distortion when amplifying signals.

In addition, various levels of precision may be used as the precision of detection of distortion by the distortion detection loop as long as they are of a degree that is effective in practical use, for example.

In addition, various levels of precision may be used as the precision of removal of distortion by the distortion removal loop (to wit, the precision of compensation for distortion) as long as they are of a degree that is effective in practical use, for example.

In addition, the digital baseband signal used may be, for example, a baseband frequency band which is a digital signal consisting of an I component and a Q component.

In addition, various signals may be used as the carrier signal used by the first digital modulation means and the carrier signal used by the second digital modulation means.

In addition, various modulation schemes may be used as the modulation scheme used by the first digital modulation means and the modulation scheme used by the second digital modulation means.

Note that the same modulation processing may be performed using the same carrier signal and the same modulation scheme in both the first digital modulation means and the second digital modulation means, for example.

In addition, the modulated signal obtained from the first digital modulation means and the modulated signal obtained from the second digital modulation means may be analog signals, for example.

In addition, various degrees of delay may be used as the degree of delaying the other digital baseband signal by means of the delay means; for example, a degree of delay may be used such that it is possible to adjust the timing of processing of one branch of the divided signal (one digital baseband signal or one modulated signal) and the other branch of the divided signal (the other digital baseband signal or the other modulated signal) so that the distortion arising in the amplifier is (appropriately) detected by the distortion detection means.

In addition, a digital delay circuit may be used as the delay means, for example.

In addition, various degrees may be used as the degree of changing the phase of the modulated signal by the phase-change means; for example, a degree of phase change may be used such that the phase relationship between one branch of the divided signal (one digital baseband signal or one modulated signal) and the other branch of the divided signal (the other digital baseband signal or the other modulated signal) so that the distortion arising in the amplifier is (appropriately) detected by the distortion detection means.

In addition, in the distortion detection means, by taking the signal amplified by the amplifier and subtracting the modulated signal whose phase is changed by the phase-change means, the distortion arising in said amplifier may be detected, for example. To wit, in general, the signal amplified by the amplifier contains signal components subject to amplification and distortion components arising in said amplifier, and the modulated signal whose phase is changed by the phase-change-means contains only the signal components subject to amplification, so by taking the difference between these, it is possible to obtain the distortion components arising in the amplifier.

In addition, in one sample configuration, the distortion detection loop is provided with a division means that divides the digital baseband signal subject to amplification into two. In this configuration, one branch of the divided signal produced by the division means is processed by the first digital modulation means as one digital baseband signal while the other branch of the divided signal is processed by the delay means as the other branch of the digital baseband signal. Note that the division means may be constituted by means of a divider or directional coupler that bisects the signal, for example, or by using wiring or the like that bisects the signal, for example.

In addition, the amplification device according to the present invention has a distortion detection loop that amplifies the signal subject to amplification with an amplifier and detects the distortion arising in said amplifier, and a distortion removal loop that removes the distortion detected by the distortion detection loop from the signal amplified by said amplifier, and the distortion detection loop and distortion removal loop compensate for the distortion that arises in said amplifier by means of a feedforward scheme, based on a distortion detection loop constituted as follows.

To wit, in the distortion detection loop, a digital filter filters the digital baseband signal subject to amplification, division means divides into two the digital baseband signal filtered by the digital filter, digital modulation means performs modulation with one branch of the digital baseband signal divided by the division means, an amplifier amplifies the modulated signal obtained from the digital modulation means, D/A conversion means converts the other branch of the digital baseband signal to an analog baseband signal, delay means delays the analog baseband signal obtained from the D/A conversion means, analog modulation means performs modulation by means of the analog baseband signal delayed by the delay means, phase-change means changes the phase of the modulated signal obtained from the analog modulation means, and distortion detection means detects the distortion arising in said amplifier from the signal amplified by the amplifier and the modulated signal whose phase is changed by the phase-change means.

Accordingly, for example, if a constitution is adopted such that a baseband signal in a frequency band lower than the wireless frequency band (the analog baseband signal) is subject to delay by the delay means of the distortion detection loop and this baseband signal is converted to a signal in the wireless frequency band by means of modulation of the carrier frequency of the wireless frequency band after this delay, it is possible to achieve a smaller device footprint and lower cost than in the prior art, for example.

Here, the digital filter used may be, for example, one that has filtering characteristics that limit the bandwidth of the digital baseband signal subject to amplification.

In addition, various means may be used as the division means.

In addition, various modulation schemes may be used in the digital modulation means.

In addition, various modulation schemes may be used in the analog modulation means.

Note that the same modulation processing may be performed using the same modulation scheme so that the same modulated signal is obtained in both the digital modulation means and the analog modulation means, for example.

In addition, the modulated signal obtained from the digital modulation means and the modulated signal obtained from the analog modulation means may be an analog signal, for example.

In addition, various degrees of delay may be used as the degree of delaying the analog baseband signal by means of the delay means; for example, a degree of delay may be used such that it is possible to adjust the timing of processing of one branch of the divided signal and the other branch of the divided signal so that the distortion arising in the amplifier is (appropriately) detected by the distortion detection means.

In addition, an analog delay circuit may be used as the delay means, for example.

In addition, various degrees may be used as the degree of changing the phase of the modulated signal by the phase-change means; for example, a degree of phase change may be used such that the phase relationship between one branch of the divided signal and the other branch of the divided signal so that the distortion arising in the amplifier is (appropriately) detected by the distortion detection means.

Here follows another sample configuration of the amplification device according to the present invention.

The amplification device according to the present invention has a distortion detection loop that amplifies the signal subject to amplification with an amplifier and detects the distortion arising in said amplifier, and a distortion removal loop that removes the distortion detected by the distortion detection loop from the signal amplified by said amplifier, and the distortion detection loop and distortion removal loop compensate for the distortion that arises in said amplifier by means of a feedforward scheme, based on a distortion detection loop constituted as follows.

To wit, a digital filter filters the digital baseband signal subject to amplification, division means divides into two the digital baseband signal filtered by the digital filter, a first D/A conversion means converts one branch of the digital baseband signal divided by the division means to an analog baseband signal, a first analog modulation means performs modulation with the analog baseband signal obtained from the first D/A conversion means, an amplifier amplifies the modulated signal obtained from the first analog modulation means, a second D/A conversion means converts the other branch of the digital baseband signal to an analog baseband signal, delay means delays the analog baseband signal obtained from the second D/A conversion means, the second analog modulation means performs modulation by means of the analog baseband signal delayed by the delay means, phase-change means changes the phase of the modulated signal obtained from the second analog modulation means, and distortion detection means detects the distortion arising in said amplifier from the signal amplified by the amplifier and the modulated signal whose phase is changed by the phase-change means.

Accordingly, for example, if a constitution is adopted such that a baseband signal in a frequency band lower than the wireless frequency band (the analog baseband signal) is subject to delay by the delay means of the distortion detection loop and this baseband signal is converted to a signal in the wireless frequency band by means of modulation of the carrier frequency of the wireless frequency band after this delay, it is possible to achieve a smaller device footprint and lower cost than in the prior art, for example.

Note that the same modulation processing may be performed using the same modulation scheme in both the first analog modulation means and the second analog modulation means, for example.

In addition, an analog delay circuit may be used as the delay means, for example.

In addition, with the amplification device according to the present invention, in the event that there is no need to perform the adjustment of the phase relationship among the two signals by means of the aforementioned phase-change means, it is possible to use a configuration wherein the distortion detection loop does is not provided with a phase-change means. In this configuration, the distortion detection loop is provided with a distortion detection means that detects the distortion arising in this amplifier from the signal amplified by the amplifier and the modulated signal (the modulated signal obtained from the second digital modulation means, the modulated signal obtained from the analog modulation means, or the modulated signal obtained from the second analog modulation means).

The amplification device according to the present invention compensates for the distortion that arises in said amplifier by means of a feedforward scheme, based on a distortion detection loop constituted as follows.

To wit, the distortion removal means is constituted using delay means that delays the signal amplified by the amplifier of the distortion detection loop, a distortion amplifier that amplifies the distortion detected by the distortion detection means of the distortion detection loop and distortion removal means that removes the signal amplified by the distortion amplifier from the amplified signal delayed by the delay means. Moreover, in the distortion removal loop, the delay means delays the signal amplified by the amplifier of the distortion detection loop, the distortion amplifier amplifies the distortion detected by the distortion detection means of the distortion detection loop and the distortion removal means removes the signal amplified by the distortion amplifier from the amplified signal delayed by the delay means.

Here, amplifiers of various constitutions may be used as the distortion amplifier.

In addition, in the distortion removal means, by taking the amplified signal delayed by the delay means and subtracting the signal amplified by the distortion amplifier, the distortion components contained in said delayed amplified signal are diminished. Note that this delayed amplified signal corresponds to the signal amplified by the amplifier of the distortion detection loop, and this signal amplified by the distortion amplifier corresponds to a signal in which the distortion detected by the distortion detection loop is amplified.

In addition, with the amplification device according to the present invention, as one sample configuration, a delay filter is used as the delay means of the distortion removal loop.

In this configuration, when processing signals in high frequency bands for example, it is possible to make the device compact and also diminish losses on the output side of distortion-compensated amplified signals.

In addition, the amplification device according to the present invention as described above is suitable for use in a base station provided in a mobile communications system, for example.

To wit, with a base station according to the present invention, the amplification device according to the present invention as described above is provided and signals subject to transmission to mobile stations are amplified by said amplification device and transmitted wirelessly.

Here, various systems are applicable as the mobile communications systems; for example, cellular phone systems and Personal Handy phone Systems (PHS) are applicable.

In addition, various communication protocols can be used as the communication protocol; for example, Code Division Multiple Access (CDMA), Time Division Multiple Access (TDMA), Frequency Division Multiple Access (FDMA) or other communications protocols may be used.

BRIEF EXPLANATION OF THE DRAWINGS

FIG. 1 is a diagram of an example of the constitution of the amplification device according to Preferred Embodiment 1.

FIG. 2 is a diagram of an example of the constitution of the amplification device according to Preferred Embodiment 2.

FIG. 3 is a diagram of an example of the constitution of the amplification device according to Preferred Embodiment 3.

FIG. 4 is a diagram of an example of the constitution of the amplification device according to Preferred Embodiment 4.

FIG. 5 is a diagram of an example of the constitution of the amplification device according to Preferred Embodiment 5.

FIG. 6 is a diagram of an example of the constitution of an amplification device according to an example of prior art.

DESCRIPTION OF THE PREFERRED EMBODIMENTS

Here follows a description of preferred embodiments of the present invention made with reference to the figures.

We shall first describe an amplification device of Preferred Embodiment 1.

FIG. 1 shows an example of the constitution of an amplification device that performs distortion compensation by means of the feedforward scheme.

The amplification device in this embodiment is installed in a base station provided in a mobile communications system. The signals subject to transmission from this base station to the mobile stations are input as a digital baseband signal, and these signals are amplified and output as signals in the wireless frequency band. The amplified signals thus output are transmitted wirelessly by the base station.

As shown in the figure, the amplification device according to this embodiment comprises a distortion detection loop and a distortion removal loop.

The distortion detection loop of this embodiment is constituted using a carrier oscillator 1, digital quadrature modulator 2 (called the first digital quadrature modulator), delay circuit 3, digital quadrature modulator 4 (called the second digital quadrature modulator), amplifier 5 (called the main amplifier), phase adjuster 6 and a directional coupling 7.

The distortion removal loop of this embodiment is constituted using a delay line 8, amplifier 9 (called the auxiliary amplifier) and a directional coupling 10. In addition, the output terminal Q1 is also shown in the figure.

Here follows a description of an example of the operation of the distortion detection loop of this embodiment.

In the distortion detection loop of this embodiment, a digital baseband signal consisting of an I component and Q component is input from an input terminal (not shown) as the signal subject to amplification. This digital baseband signal is then divided into two and one branch of the divided signal is provided as input to the first digital quadrature modulator 2, while the other branch of the divided signal is input to the delay circuit 3.

The carrier oscillator I generates a carrier signal in the wireless frequency band, for example, and this carrier signal is output to the first digital quadrature modulator 2 and second digital quadrature modulator 4.

The delay circuit 3 may be constituted using a digital delay circuit, for example, which applies a delay to the digital baseband signal (the other branch of the divided signal) which is then output to the second digital quadrature modulator 4. Note that the delay circuit 3 may apply a time delay to the signal of 10 ns, for example.

The first digital quadrature modulator 2 and second digital quadrature modulator 4 both consist of quadrature modulators that have the same functions.

The first digital quadrature modulator 2 uses the input digital baseband signal (one branch of the divided signal) to perform digital quadrature modulation of the carrier signal input from the carrier oscillator 1, and outputs the modulated signal thus obtained to the main amplifier 5.

The second digital quadrature modulator 4 uses the digital baseband signal input from the delay circuit 3 to perform digital quadrature modulation of the carrier signal input from the carrier oscillator 1, and outputs the modulated signal thus obtained to the phase adjuster 6.

The main amplifier 5 amplifies the modulated signal input from the first digital quadrature modulator 2 and outputs the amplified signal to the directional coupling 7. Here, when the signal is amplified in the main amplifier 5, distortion consisting of frequencies different from the frequency of the signal subject to amplification or the like arises, and this distortion is subject to the distortion compensation according to this embodiment.

The phase adjuster 6 changes the phase of the modulated signal input from the second digital quadrature modulator 4 and outputs this phase-changed modulated signal to the directional coupling 7.

The directional coupling 7 takes the amplified signal input from the main amplifier 5 and outputs it to the delay line 8 and also combines this amplified signal with the modulated signal input from the phase adjuster 6, subtracts the modulated signal from the amplified signal and outputs the resulting signal to the auxiliary amplifier 9. Here, the signal output from the directional coupling 7 to the auxiliary amplifier 9 is equivalent to the distortion detected by the distortion detection loop, and in this embodiment, by setting appropriate values for the delay time in the delay circuit 3 and the amount of phase change in the phase adjuster 6, the circuit may be adjusted so that only the distortion components arising in the main amplifier 5 are detected by the distortion detection loop.

Here follows a description of an example of the operation of the distortion removal loop of this embodiment.

Note that the constitution and operation of the distortion removal loop of this embodiment may be the same as the constitution and operation of the distortion removal loop provided in the amplification device illustrated in FIG. 6 above.

The delay line 8 delays the amplified signal input from directional coupling 7 and outputs it to directional coupling 10.

The auxiliary amplifier 9 amplifies the distortion input from directional coupling 7 and outputs this amplified signal to directional coupling 10.

The directional coupling 10 combines the amplified signal (called the main amplified signal) input from the delay line 8 with the amplified signal (called the auxiliary amplified signal) input from the auxiliary amplifier 9, subtracts the auxiliary amplified signal from the main amplified signal and outputs the resulting signal to the output terminal Q1. Here, the signal output from the directional coupling 10 to the output terminal Q1 is equivalent to the main amplified signal on which distortion compensation is performed, and in this embodiment, by setting the delay time in the delay line 8 to an appropriate value, the circuit may be adjusted so that only the distortion components arising in the main amplifier 5 are removed from the main amplified signal.

We shall now use numeric formulae to present a specific description of the method by which the distortion detection loop of the amplification device of this embodiment performs distortion detection.

For example, the carrier signal may be represented by $\exp j(\omega t)$ and the digital baseband signal subject to amplification may be represented by $A(t) \exp j\{B(t)\}$. Here, j is an imaginary number, $\omega$ is the angular velocity, t is the time, while A(t) and B(t) represent functions of the time t.

In this case, if the delay time due to the delay circuit 3 is $\tau$, then the modulated signal C' obtained from the first digital quadrature modulator 2 is as shown in Equation 1, while the modulated signal G' obtained from the second digital quadrature modulator 4 is as shown in Equation 2.

$$C'=A(t)\exp j\{\omega t+B(t)\} \quad \text{(Equation 1)}$$

$$G'=A(t-\tau)\exp j\{\omega t+B(t-\tau)\} \quad \text{(Equation 2)}$$

In addition, if the delay time due to the amplification process of the main amplifier 5 is $\tau$, then the signal F' of the carrier components that constitute the distortion-containing (namely, containing distortion) amplified signal output from the main amplifier 5 is as shown in Equation 3.

$$F'=A(t-\tau)\exp j\{\omega(t-\tau)+B(t-\tau)\} \quad \text{(Equation 3)}$$

In addition, if the amount of phase change due to the phase adjuster 6 is $-\theta$, then the distortion-free (namely, containing no distortion) modulated signal D' output from the phase adjuster 6 is as shown in Equation 4.

$$D'=A(t-\tau)\exp j\{\omega t+B(t-\tau)-\theta\} \quad \text{(Equation 4)}$$

Here, when distortion compensation is performed by the feedforward scheme, it is necessary to remove the carrier components regarding the output on the auxiliary amplifier 9 side of the directional coupling 7 of the distortion detection loop.

To this end, in this embodiment, the amount of phase change due to the phase adjuster 6 is set as $-\theta=-\omega t$. Upon doing so, the modulated signal D' output from the phase adjuster 6 becomes as shown in Equation 5. In addition, the residual carrier component E' in the output on the output on the auxiliary amplifier 9 side of the directional coupling 7 of the distortion detection loop becomes zero.

$$D'=A(t-\tau)\exp j\{(t-\tau)+B(t-\tau)\} \quad \text{(Equation 5)}$$

$$E'=F'-D'=0 \quad \text{(Equation 6)}$$

As described above, with the amplification device according to this embodiment, the distortion detection loop consists of two digital quadrature modulators 2 and 4, where the first digital quadrature modulator 2 performs modulation with the non-delayed digital baseband signal and the main amplifier 5 amplifies the modulated signal, but on the other hand, the delay circuit 3 delays the digital baseband signal and the first digital quadrature modulator 2 performs modulation with this delayed digital baseband signal. In addition, the phase adjuster 6 adjusts the phase of the signal modulated by the second digital quadrature modulator 4, so the directional coupling 7 detects the distortion components contained in the signal amplified by the main amplifier 5.

Accordingly, with the amplification device according to this embodiment, the delay of the signal in the distortion detection loop is performed in the baseband frequency band, so it is possible to achieve a smaller device footprint and lower cost than in the prior art.

In addition, with the amplification device according to this embodiment, because of the constitution whereby the signal is delayed in the baseband frequency band, it is possible to adopt a digital delay process, for example, and thus delay the signal by a digital process and thereby decrease costs. In addition, with the adoption of a digital delay process, it is possible to use a computer or the like to automate the adjustment of the delay time in the distortion detection loop, for example, and thus it is possible to shorten the time required for the delay time adjustment work.

Note that regarding the delay circuit 3, in a realistic device for example, adjusting the delay to 10 ns is thought to require resolution on the scale of 0.1 ns, and this resolution is not thought to be achievable with currently available digital signal processor (DSP) technology. To solve this problem, as another sample constitution for the amplification device according to this embodiment, it is effective to use a constitution whereby a delay line that delays the signal is used together with the delay circuit 3. To wit, by adopting a constitution whereby the rough delay adjustment is performed with the delay circuit 3 and the fine tuning of the delay time is performed with a delay line, it is possible to eliminate the roughly 2-m length of the delay line 73 provided in the distortion detection loop of the prior-art amplification device shown in FIG. 6 above. To wit, in this embodiment, by providing the distortion detection loop with a relatively short delay line required for fine tuning of the delay time, it is possible to maintain a high degree of precision in the delay time. Here, various locations are possible as the location where the delay line is to be provided in the distortion detection loop, for example, before or after the delay circuit 3 or after the second digital quadrature modulator 4.

Here, in the distortion detection loop of the amplification device according to this embodiment, the first digital modulation means referred to in the present invention is constituted by means of the functions of the first digital quadrature modulator 2, the amplifier referred to in the present invention is constituted by means of the functions of the main amplifier 5, the delay means referred to in the present invention is constituted by means of the functions of the delay circuit 3, the second digital modulation means referred to in the present invention is constituted by means of the functions of the second digital quadrature modulator 4, the phase-change means referred to in the present invention is constituted by means of the functions of the phase adjuster 6, and the distortion detection means referred to in the present invention is constituted by means of the functions of the directional coupling 7.

In addition, in the distortion detection loop of the amplification device according to this embodiment, the delay means is constituted by means of the functions of the delay line 8, the distortion amplifier is constituted by means of the functions of the auxiliary amplifier 9, and the distortion removal means is constituted by means of the functions of the directional coupling 10.

We will now describe the amplification device according to Preferred Embodiment 2.

FIG. 2 shows an example of the constitution of an amplification device that performs distortion compensation by means of the feedforward scheme.

As in the case of Preferred Embodiment 1 above, the amplification device in this embodiment is installed in a base station provided in a mobile communications system, and the signal subject to amplification is input as a digital baseband signal.

As shown in the figure, the amplification device according to this embodiment comprises a distortion detection loop and a distortion removal loop.

The distortion detection loop of this embodiment is constituted using a digital filter 11, digital quadrature modulator 12, digital-to-analog (D/A) converter 13, delay circuit 14, analog quadrature modulator 15, amplifier 16 (called the main amplifier), phase adjuster 17 and a directional coupling 18.

The distortion removal loop of this embodiment is constituted using a delay line 19, amplifier 20 (called the auxiliary amplifier) and a directional coupling 21. In addition, the output terminal Q2 is also shown in the figure.

Note that the constitution and operation of the distortion removal loop according to this embodiment are identical to the constitution and operation of the distortion removal loop provided in the amplification device shown in FIG. 1 for Preferred Embodiment 1 above.

Here follows a description of an example of the operation of the distortion detection loop of this embodiment.

In the distortion detection loop of this embodiment, a digital baseband signal consisting of an I component and Q component is input to the digital filter 11 from an input terminal (not shown) as the signal subject to amplification.

The digital filter 11 filters the input digital baseband signal and outputs the filtered digital baseband signal. This output digital baseband signal is divided into two branches, and one branch of the divided signal is provided as input to the digital quadrature modulator 12, while the other branch of the divided signal is input to the D/A converter 13.

Here, the digital filter 11 performs bandwidth limitation for the signal. A root Nyquist filter is a typical example of a filter that can be used for the digital filter 11. Performing bandwidth limitation with the digital filter 11 solves the problem whereby the bandwidth occupied by the modulation signal becomes infinitely wide when direct modulation is performed with the I component signal or Q component signal.

The digital quadrature modulator 12 uses the digital baseband signal (one branch of the divided signal) output from the digital filter 11 as input to perform digital quadrature modulation, and outputs the modulated signal thus obtained to the main amplifier 16.

The D/A converter 13 performs a digital to analog conversion (D/A conversion) on the digital baseband signal (the other branch of the divided signal) output from the digital filter 11 and input, and provides the analog baseband signal thus obtained as output to the delay circuit 14.

The delay circuit 14 may be constituted using an analog delay circuit, for example. The analog baseband signal input from the D/A converter 13 is delayed and output to the analog quadrature modulator 15. Note that the delay circuit 14 may apply a time delay to the signal of 10 ns, for example.

Here follows an explanation of the reason for using an analog delay in this embodiment.

To wit, in the current state, the delay time due to the amplification process is roughly 10–20 ns, so 1/100 of this, or 0.1–0.2 ns is required as the precision of adjustment of the delay time. If so, a minimum clock speed of 10 GHz which corresponds to 0.1 ns is necessary, but operation at such high clock speeds is not thought to be achievable at present. Thus, in this embodiment we present an example of the constitution of a distortion detection loop that uses an analog delay. Note that in the event that a DSP or the like capable of operating at a clock speed of roughly 10 GHz is developed in the future, this can be used in a constitution that implements a digital delay.

In addition, the delay circuit 14 may be constituted using a filter that delays signals (a delay filter).

As one example, the frequency components for the I component signal and Q component signal of wideband W-CDMA are at approximately 2 MHz or below. For this reason, in such a system, when a filter is used for the purpose of delay, the delay characteristics in the frequency components at approximately 2 MHz or below must be flat (flat delay characteristics are necessary). Accordingly, an example of the type of filter preferably used is a Bessel low pass filter (with a cutoff frequency $f_c = \sim 2$ MHz), while it is also possible to use an active filter using an operational amplifier (op-amp) since a baseband signal at 2 MHz or below is handled.

The analog quadrature modulator 15 performs analog quadrature modulation with the analog baseband signal input from the delay circuit 14 and outputs to the phase adjuster 17 the modulated signal thus obtained.

In addition, the operation of the main amplifier 16, phase adjuster 17 and directional coupling 18 may be the same as that illustrated in Preferred Embodiment 1 above, for example, while the directional coupling 18 detects the distortion components contained in the signal amplified by the main amplifier 16.

As described above, with the amplification device according to this embodiment, the delay of the signal in the distortion detection loop is performed in the baseband frequency band, so it is possible to achieve a smaller device footprint and lower cost than in the prior art.

Here, in the distortion detection loop of the amplification device according to this embodiment, the digital filter referred to in the present invention is constituted by means of the functions of the digital filter 11, the division means referred to in the present invention is constituted by means of the function of bisecting the signal output from the digital filter 11, the digital modulation means referred to in the present invention is constituted by means of the functions of the digital quadrature modulator 12, the amplifier referred to in the present invention is constituted by means of the functions of the main amplifier 16, the D/A conversion means referred to in the present invention is constituted by means of the functions of the D/A converter 13, the delay means referred to in the present invention is constituted by means of the functions of the delay circuit 14, the analog modulation means referred to in the present invention is constituted by means of the functions of the analog quadrature modulator 15, the phase-change means referred to in the present invention is constituted by means of the functions of the phase adjuster 17, and the distortion detection means referred to in the present invention is constituted by means of the functions of the directional coupling 18.

The following preferred embodiments illustrate other examples of the constitution of an amplification device that performs distortion compensation by means of the feedforward scheme.

We will first describe the amplification device according to Preferred Embodiment 3.

FIG. 3 shows an example of the constitution of an amplification device that performs distortion compensation by means of the feedforward scheme.

As in the case of Preferred Embodiment 1 above, the amplification device in this embodiment is installed in a base station provided in a mobile communications system, and the signal subject to amplification is input as a digital baseband signal.

As shown in the figure, the amplification device according to this embodiment comprises a distortion detection loop and a distortion removal loop.

The distortion detection loop of this embodiment is constituted using a digital filter 31, D/A converter 32 (called the first D/A converter), D/A converter 33 (called the second D/A converter), carrier oscillator 34, analog quadrature modulator 35 (called the first analog quadrature modulator), delay circuit 36, analog quadrature modulator 37 (called the second analog quadrature modulator), amplifier 38 (called the main amplifier), phase adjuster 39 and a directional coupling 40.

The distortion removal loop of this embodiment is constituted using a delay line 41, amplifier 42 (called the auxiliary amplifier) and a directional coupling 43. In addition, the output terminal Q3 is also shown in the figure.

Note that the constitution and operation of the distortion removal loop according to this embodiment are identical to the constitution and operation of the distortion removal loop provided in the amplification device shown in FIG. 1 for Preferred Embodiment 1 above.

Here follows a description of an example of the operation of the distortion detection loop of this embodiment.

In the distortion detection loop of this embodiment, a digital baseband signal consisting of an I component and Q component is input to the digital filter 31 from an input terminal (not shown) as the signal subject to amplification.

The digital filter 31 filters the input digital baseband signal and outputs the filtered digital baseband signal. This output digital baseband signal is divided into two branches, and one branch of the divided signal is provided as input to the first D/A converter 32, while the other branch of the divided signal is input to the second D/A converter 33.

The first D/A converter 32 performs a digital to analog conversion (D/A conversion) on the digital baseband signal (one branch of the divided signal) output from the digital filter 31 and input, and provides the analog baseband signal thus obtained as output to the first analog quadrature modulator 35.

The second D/A converter 33 performs a digital to analog conversion (D/A conversion) on the digital baseband signal (the other branch of the divided signal) output from the digital filter 31 and input, and provides the analog baseband signal thus obtained as output to the delay circuit 36.

The delay circuit 36 may be constituted using an analog delay circuit, for example. The analog baseband signal input from the second D/A converter 33 is delayed and output to the second analog quadrature modulator 37. Note that the delay circuit 36 may apply a time delay to the signal of 10 ns, for example.

The carrier oscillator 34 generates a carrier signal in the wireless frequency band, for example, and this carrier signal is output to the first analog quadrature modulator 35 and second analog quadrature modulator 37.

The first analog quadrature modulator 35 and second analog quadrature modulator 37 both consist of quadrature modulators that have the same functions.

The first analog quadrature modulator 35 uses the analog baseband signal input from the first D/A converter 32 to perform analog quadrature modulation of the carrier signal input from the carrier oscillator 34, and outputs the modulated signal thus obtained to the main amplifier 38.

The second analog quadrature modulator 37 uses the analog baseband signal input from the delay circuit 36 to perform analog quadrature modulation of the carrier signal input from the carrier oscillator 34, and outputs the modulated signal thus obtained to the phase adjuster 39.

In addition, the operation of the main amplifier 38, phase adjuster 39 and a directional coupling 40 may be the same as that illustrated in Preferred Embodiment 1 above, for example, while the directional coupling 40 detects the distortion components contained in the signal amplified by the main amplifier 38.

As described above, with the amplification device according to this embodiment, the delay of the signal in the distortion detection loop is performed in the baseband frequency band, so it is possible to achieve a smaller device footprint and lower cost than in the prior art.

Note that in a constitution wherein, among the two branches of the digital baseband signal subject to amplification that is divided into two, one branch of the signal is subjected to quadrature modulation by a digital quadrature modulator while the other branch of the signal is subjected to quadrature modulation by an analog quadrature modulator, it is possible that the orthogonality may differ between the two quadrature modulators, or a phase shift (frequency offset) may occur in the carrier signal at the time of minute fluctuations in the characteristics of the phase-locked loop (PLL). For this reason, if quadrature modulation is to be performed digitally, it is preferable to provide digital quadrature modulators for both the branches of the signal. Similarly, if analog quadrature modulation is to be performed, it is preferable to provide analog quadrature modulators for both branches of the signal. With the amplification device according to this embodiment, two analog quadrature modulators 35 and 37 are provided as a preferred embodiment of the constitution.

We will now describe the amplification device according to Preferred Embodiment 4.

FIG. 4 shows an example of the constitution of an amplification device that performs distortion compensation by means of the feedforward scheme.

As in the case of Preferred Embodiment 1 above, the amplification device in this embodiment is installed in a base station provided in a mobile communications system, and the signal subject to amplification is input as a digital baseband signal.

As shown in the figure, the amplification device according to this embodiment comprises a distortion detection loop and a distortion removal loop.

The distortion detection loop of this embodiment is constituted using a carrier oscillator 51, digital quadrature modulator 52 (called the first digital quadrature modulator), delay circuit 53, digital quadrature modulator 54 (called the second digital quadrature modulator), amplifier 55 (called the main amplifier) and a directional coupling 56.

The distortion removal loop of this embodiment is constituted using a delay line 57, amplifier 58 (called the auxiliary amplifier) and a directional coupling 59. In addition, the output terminal Q4 is also shown in the figure.

Note that the constitution and operation of the distortion removal loop according to this embodiment are identical to the constitution and operation of the distortion removal loop provided in the amplification device shown in FIG. 1 for Preferred Embodiment 1 above.

Here, the constitution and operation of the distortion detection loop according to this embodiment are identical to the constitution and operation of the distortion detection loop provided in the amplification device shown in FIG. 1 for Preferred Embodiment 1 above, with the exception that no phase adjuster is provided between the second digital quadrature modulator 54 and a directional coupling 56, for example. In this embodiment, even if no such phase adjuster is provided, the phase relationship between the signal flowing along the path which has the first digital quadrature modulator 52 and main amplifier 55 and the signal flowing along the path which has the delay circuit 53 and second digital quadrature modulator 54 may be appropriately adjusted by the characteristics of one of the circuit portions within the distortion detection loop, for example.

As described above, with the amplification device according to this embodiment, the same meritorious effects can be obtained as in the case of the amplification device illustrated in Preferred Embodiment 1 above, for example.

We will now describe the amplification device according to Preferred Embodiment 5.

FIG. 5 shows an example of the constitution of an amplification device that performs distortion compensation by means of the feedforward scheme.

As in the case of Preferred Embodiment 1 above, the amplification device in this embodiment is installed in a base station provided in a mobile communications system, and the signal subject to amplification is input as a digital baseband signal.

As shown in the figure, the amplification device according to this embodiment comprises a distortion detection loop and a distortion removal loop.

The distortion detection loop of this embodiment is constituted using a carrier oscillator 61, digital quadrature modulator 62 (called the first digital quadrature modulator), delay circuit 63, digital quadrature modulator 64 (called the second digital quadrature modulator), amplifier 65 (called the main amplifier) and a directional coupling 66.

Note that the constitution and operation of the distortion detection loop according to this embodiment are identical to the constitution and operation of the distortion detection loop provided in the amplification device shown in FIG. 4 for Preferred Embodiment 4 above.

The distortion removal loop of this embodiment is constituted using a delay filter 67, amplifier 68 (called the auxiliary amplifier) and a directional coupling 69. In addition, the output terminal Q5 is also shown in the figure.

Here, the constitution and operation of the distortion removal loop according to this embodiment are identical to the constitution and operation of the distortion removal loop provided in the amplification device shown in FIG. 1 for Preferred Embodiment 1 above, with the exception that a delay filter is used as the means of delaying the signal amplified by the main amplifier 65, for example.

As described above, with the amplification device according to this embodiment, the delay filter 67 is used as the delay means of the distortion removal loop. Thereby, when processing a signal with a frequency of 1.5 GHz or greater, for example, it is possible to make the device more compact and reduce output-side loss.

Here, the constitution of the amplification device, base station, mobile station, mobile communications system and the like according to the present invention is not necessarily limited to that presented above, but rather various constitutions may be used. Note that the present invention may also be provided as a method of executing the process according to the present invention, or as a computer program for implementing such a method.

In addition, the applicable fields of the present invention are not necessarily limited to those illustrated above, but rather the present invention may be applied to various fields.

In addition, the various processing performed in the amplification device or the like according to the present invention may be constituted by being implemented in hardware resources equipped with a processor and memory and the like, for example, being controlled by means of a processor executing a control program stored in read-only memory (ROM). In addition, the various functional means for executing this processing may also be constituted as independent hardware circuits.

In addition, the present invention may also be understood as one wherein the above control program (itself) is stored in a floppy disc®, CD-ROM or other computer-readable recording media, so that the processing according to the present invention can be implemented by loading said control program from the recording medium into a computer and executing the program by a processor.

As described above, with the amplification device according to the present invention, it has a distortion detection loop and distortion removal loop so at the time of compensating for distortion arising in the amplifier, in the distortion detection loop, among the two branches of the signal subject to amplification that is divided into two, an amplifier (main amplifier) amplifies one branch of the signal, the other branch of the signal is delayed and then distortion arising in the amplifier is detected from these two signals, and the delay is performed in the stage in which the other branch of the signal is a baseband signal, so it is possible to reduce achieve a smaller device footprint and lower cost.

What is claimed is:

1. An amplification device having a distortion detection loop that uses an amplifier to amplify a signal subject to amplification and detect a distortion arising in said amplifier, and a distortion removal loop that removes the distortion detected by the distortion detection loop from the signal amplified by said amplifier, wherein:

the distortion detection loop comprises:
  a first modulation means that, among two branches of a baseband signal subject to amplification that is divided into two, uses one branch of the baseband signal to modulate a carrier signal;
  an amplifier that amplifies the modulated signal obtained from the first modulation means;
  delay means that delays the other branch of the baseband signal;
  a second modulation means that uses the other branch of the baseband signal delayed by the delay means to modulate a carrier signal; and
  distortion detection means that detects the distortion arising in said amplifier from the signal amplified by the amplifier and the modulated signal obtained from the second modulation means.

2. The amplification device according to claim 1, wherein the baseband signal is a digital baseband signal, wherein the first modulation means is a first digital modulation means, and wherein the second modulation means is a second digital modulation means.

3. The amplification device according to claim 1, wherein the baseband signal is a digital baseband signal, and wherein the distortion detection loop further comprises:
  a digital filter that filters the digital baseband signal;
  division means that divides into two the digital baseband signal filtered by the digital filter; and
  D/A conversion means that converts the other branch of the digital baseband signal to an analog baseband signal,
  wherein the first modulation means is a digital modulation means that performs modulation with one branch of the digital baseband signal divided by the division means,
  wherein the delay means delays the analog baseband signal obtained from the D/A conversion means, and wherein the second modulation means is an analog modulation means that performs modulation by means of the analog baseband signal delayed by the delay means.

4. The amplification device according to claim 1, wherein the baseband signal is a digital baseband signal, and
wherein the distortion detection loop further comprises:
a digital filter that filters the digital baseband signal;
division means that divides into two the digital baseband signal filtered by the digital filter;
a first D/A conversion means that converts one branch of the digital baseband signal divided by the division means to an analog baseband signal; and
a second D/A conversion means that converts the other branch of the digital baseband signal to an analog baseband signal,
wherein the first modulation means is a first analog modulation means that performs modulation with the analog baseband signal obtained from the first D/A conversion means,
wherein the delay means delays the analog baseband signal obtained from the second D/A conversion means, and
wherein the second modulation means is a second analog modulation means that performs modulation by means of the analog baseband signal delayed by the delay means.

5. The amplification device according to claim 2, further comprising:
phase-change means that changes the phase of the modulated signal obtained from the second digital modulation means, wherein:
the distortion detection means detects the distortion arising in said amplifier from the signal amplified by the amplifier and the modulated signal whose phase is changed by the phase-change means.

6. The amplification device according to claim 2, wherein:
the distortion removal loop comprises:
delay means that delays the signal amplified by the amplifier of the distortion detection loop;
a distortion amplifier that amplifies the distortion detected by the distortion detection means of the distortion detection loop; and
distortion removal means that removes the signal amplified by the distortion amplifier from the amplified signal delayed by the delay means.

7. The amplification device according to claim 5, wherein:
the distortion removal loop comprises:
delay means that delays the signal amplified by the amplifier of the distortion detection loop;
a distortion amplifier that amplifies the distortion detected by the distortion detection means of the distortion detection loop; and
distortion removal means that removes the signal amplified by the distortion amplifier from the amplified signal delayed by the delay means.

8. The amplification device according to claim 6, wherein:
a delay filter is used as the delay means of the distortion removal loop.

9. The amplification device according to claim 7, wherein:
a delay filter is used as the delay means of the distortion removal loop.

10. The amplification device according to claim 3, further comprising:
phase-change means that changes the phase of the modulated signal obtained from the analog modulation means, wherein:
the distortion detection means detects the distortion arising in said amplifier from the signal amplified by the amplifier and the modulated signal whose phase is changed by the phase-change means.

11. The amplification device according to claim 3, wherein:
the distortion removal loop comprises:
delay means that delays the signal amplified by the amplifier of the distortion detection loop;
a distortion amplifier that amplifies the distortion detected by the distortion detection means of the distortion detection loop; and
distortion removal means that removes the signal amplified by the distortion amplifier from the amplified signal delayed by the delay means.

12. The amplification device according to claim 10, wherein:
the distortion removal loop comprises:
delay means that delays the signal amplified by the amplifier of the distortion detection loop;
a distortion amplifier that amplifies the distortion detected by the distortion detection means of the distortion detection loop; and
distortion removal means that removes the signal amplified by the distortion amplifier from the amplified signal delayed by the delay means.

13. The amplification device according to claim 11, wherein:
a delay filter is used as the delay means of the distortion removal loop.

14. The amplification device according to claim 12, wherein:
a delay filter is used as the delay means of the distortion removal loop.

15. The amplification device according to claim 4, further comprising:
phase-change means that changes the phase of the modulated signal obtained from the second analog modulation means, wherein:
the distortion detection means detects the distortion arising in said amplifier from the signal amplified by the amplifier and the modulated signal whose phase is changed by the phase-change means.

16. The amplification device according to claim 4, wherein:
the distortion removal loop comprises:
delay means that delays the signal amplified by the amplifier of the distortion detection loop;
a distortion amplifier that amplifies the distortion detected by the distortion detection means of the distortion detection loop; and
distortion removal means that removes the signal amplified by the distortion amplifier from the amplified signal delayed by the delay means.

17. The amplification device according to claim 15, wherein:
the distortion removal loop comprises:
delay means that delays the signal amplified by the amplifier of the distortion detection loop;
a distortion amplifier that amplifies the distortion detected by the distortion detection means of the distortion detection loop; and
distortion removal means that removes the signal amplified by the distortion amplifier from the amplified signal delayed by the delay means.

18. The amplification device according to claim 16, wherein:
a delay filter is used as the delay means of the distortion removal loop.

19. The amplification device according to claim 17, wherein:
a delay filter is used as the delay means of the distortion removal loop.

20. A base station provided in a mobile communications system that uses an amplification device to amplify signals subject to transmission to mobile stations and transmit said signals wirelessly, wherein:
said amplification device comprises:
a distortion detection loop that uses an amplifier to amplify a signal subject to amplification and detect a distortion arising in said amplifier, and a distortion removal loop that removes the distortion detected by the distortion detection loop from the signal amplified by said amplifier, and
the distortion detection loop of said amplification device comprises:
a first modulation means that, among two branches of a baseband signal subject to amplification that is divided into two, uses one branch of the baseband signal to modulate a carrier signal;
an amplifier that amplifies the modulated signal obtained from the first modulation means;
delay means that delays the other branch of the baseband signal;
a second modulation means that uses the other branch of the baseband signal delayed by the delay means to modulate a carrier signal;
phase-change means that changes the phase of the modulated signal obtained from the second modulation means, and
distortion detection means that detects the distortion arising in said amplifier from the signal amplified by the amplifier and the modulated signal whose phase is changed by the phase-change means.

21. The base station according to claim 20,
wherein the baseband signal is a digital baseband signal,
wherein the first modulation means is a first digital modulation means, and
wherein the second modulation means is a second digital modulation means.

22. The base station according to claim 20, wherein the baseband signal is a digital baseband signal, and
wherein the distortion detection loop further comprises:
a digital filter that filters the digital baseband signal;
division means that divides into two the digital baseband signal filtered by the digital filter; and
D/A conversion means that converts the other branch of the digital baseband signal to an analog baseband signal,
wherein the first modulation means is a digital modulation means that performs modulation with one branch of the digital baseband signal divided by the division means,
wherein the delay means delays the analog baseband signal obtained from the D/A conversion means, and
wherein the second modulation means is an analog modulation means that performs modulation by means of the analog baseband signal delayed by the delay means.

23. The base station according to claim 20, wherein the baseband signal is a digital baseband signal, and
wherein the distortion detection loop further comprises:
a digital filter that filters the digital baseband signal;
division means that divides into two the digital baseband signal filtered by the digital filter;
a first D/A conversion means that converts one branch of the digital baseband signal divided by the division means to an analog baseband signal; and
a second D/A conversion means that converts the other branch of the digital baseband signal to an analog baseband signal,
wherein the first modulation means is a first analog modulation means that performs modulation with the analog baseband signal obtained from the first D/A conversion means,
wherein the delay means delays the analog baseband signal obtained from the second D/A conversion means, and
wherein the second modulation means is a second analog modulation means that performs modulation by means of the analog baseband signal delayed by the delay means.

* * * * *